United States Patent [19]

Baldi

[11] 4,350,719

[45] Sep. 21, 1982

[54] DIFFUSION COATING AND PRODUCTS THEREFROM

[75] Inventor: Alfonso L. Baldi, Wynnewood, Pa.

[73] Assignee: Alloy Surfaces Company, Inc., Wilmington, Del.

[21] Appl. No.: 238,500

[22] Filed: Feb. 26, 1981

Related U.S. Application Data

[63] Continuation-in-part of Ser. No. 73,539, Sep. 7, 1979, Pat. No. 4,260,654, Ser. No. 851,504, Nov. 14, 1977, and Ser. No. 809,189, Jun. 23, 1977, Pat. No. 4,308,160, said Ser. No. 73,539, is a continuation-in-part of Ser. No. 953,762, Oct. 23, 1978, Pat. No. 4,241,147, said Ser. No. 73,539, Ser. No. 851,504, Ser. No. 809,189, and Ser. No. 953,762, each is a continuation-in-part of Ser. No. 752,855, Dec. 21, 1976, Pat. No. 4,208,453, Ser. No. 694,951, Jun. 11, 1976, abandoned, and Ser. No. 614,834, Sep. 19, 1975, Pat. No. 4,141,760, which is a continuation-in-part of Ser. No. 579,945, May 22, 1975, abandoned, Ser. No. 466,908, May 31, 1974, Pat. No. 3,958,047, Ser. No. 446,473, Feb. 27, 1974, Pat. No. 3,958,046, Ser. No. 404,665, Oct. 9, 1973, Pat. No. 3,948,689, Ser. No. 357,616, May 7, 1973, Pat. No. 3,948,687, and Ser. No. 304,220, Nov. 6, 1972, Pat. No. 3,936,539, said Ser. No. 752,855, is a continuation-in-part of Ser. No. 694,951, , which is a continuation-in-part of Ser. No. 614,834, , and Ser. No. 579,945, , said Ser. No. 752,855, is a continuation-in-part of Ser. No. 614,834, , and Ser. No. 579,945, , said Ser. No. 446,473, Ser. No. 404,665, Ser. No. 357,616, and Ser. No. 304,220, each is a continuation-in-part of Ser. No. 254,403, May 18, 1972, Pat. No. 3,785,854; Ser. No. 90,682, Nov. 18, 1970, Pat. No. 3,764,371, and Ser. No. 219,514, Jan. 20, 1972, Pat. No. 3,801,357, which is a continuation-in-part of Ser. No. 837,811, Jun. 30, 1969, said Ser. No. 254,403, is a continuation-in-part of Ser. No. 219,514, , and Ser. No. 90,682, , which is a continuation-in-part of Ser. No. 219,514, , and Ser. No. 837,811, , said Ser. No. 466,908, and Ser. No. 446,473, each is a continuation-in-part of Ser. No. 404,665, , Ser. No. 357,616, , and Ser. No. 304,220, , said Ser. No. 404,665, is a continuation-in-part of Ser. No. 357,616, , and Ser. No. 304,220, , said Ser. No. 357,616, is a continuation-in-part of Ser. No. 304,220.

[51] Int. Cl.³ .................. C23C 11/04; C23C 9/02
[52] U.S. Cl. ............................ 427/253; 428/651; 428/667; 428/595; 427/255.7; 427/405; 427/319
[58] Field of Search .................. 427/253, 255.7, 405, 427/319; 428/651, 667, 586, 595

[56] References Cited

U.S. PATENT DOCUMENTS 2,851,375  9/1958  Samuel ........................... 427/253
3,936,539  2/1976  Baldi ............................. 427/253

FOREIGN PATENT DOCUMENTS

711164  1/1980  U.S.S.R. ......................... 427/253

Primary Examiner—Ralph S. Kendall
Attorney, Agent, or Firm—Connolly and Hutz

[57] ABSTRACT

Ferrous metal or titanium or aluminum is coated with a mixture of phosphoric acid, chromic acid and magnesium salts of these acids, as well as with aluminum flakes, or coated with a mixture of aluminum flakes and magnesium chromate or dichromate, to provide after baking excellent resistance to attack. Aluminum-silicon alloys containing about 10 to about 15 weight percent silicon give better results than ordinary aluminum, particularly when the aluminum is in powder form; and when coated products are given a burnishing treatment. Very good masking for pack diffusion aluminizing or chromizing on any metal to keep portions from being diffusion coated is effected by localized coating, the lowest layer of which is depletion-reducing. The upper coating layer can be of non-contaminating particles like nickel or $Cr_2O_3$ that upon aluminizing or chromizing become coherently held together to form a secure sheath. Such sheath can also be used for holding localized diffusion-coating layer in place. Low-alloy steels are made resistant to hot sulfidation by first decarburizing then chromizing then aluminizing, either in independent operations or run together in a single retort.

3 Claims, 2 Drawing Figures

DIFFUSION COATING AND PRODUCTS THEREFROM

This application is a continuation-in-part of application Ser. No. 73,539 filed Sept. 7, 1979 (U.S. Pat. No. 4,260,654 granted Apr. 7, 1981), Ser. No. 851,504 filed Nov. 14, 1977, and Ser. No. 809,189 filed June 23, 1977 (U.S. Pat. No. 4,308,160 granted Dec. 29, 1981), the first of which is a continuation-in-part of application Ser. No. 953,762 filed Oct. 23, 1978 (U.S. Pat. No. 4,241,147 granted Dec. 23, 1980), and all four earlier applications are continuations-in-part of Ser. No. 752,855 filed Dec. 21, 1976 (U.S. Pat. No. 4,208,453 granted June 17, 1980), Ser. No. 694,951 filed June 11, 1976 (subsequently abandoned) and Ser. No. 614,834 filed Sept. 19, 1975 (U.S. Pat. 4,141,760 granted Feb. 9, 1979). Ser. No. 614,834 is itself a continuation-in-part of Serial No. 579,945 filed May 22, 1975 (subsequently abandoned), Ser. No. 466,908 filed May 31, 1974 (U.S. Pat. No. 3,958,047 granted May 18, 1976) Ser. No. 446,473 filed Feb. 27, 1974 (U.S. Pat. No. 3,958,046 granted May 18, 1976), Ser. No. 404,665 filed Oct. 9, 1973 (U.S. Pat. No. 3,948,689 granted Apr. 6, 1976), Ser. No. 357,616 filed May 7, 1973 (U.S. Pat. No. 3,948,687 granted Apr. 6, 1976) and Ser. No. 304,220 filed Nov. 6, 1972 (U.S. Pat. No. 3,936,539 granted Feb. 3, 1976). Ser. No. 752,855 is a continuation-in-part of Ser. No. 694,951, and both are continuations-in-part of Ser. Nos. 614,834 and 579,945, while Ser. Nos. 446,473, 404,665, 357,616 and 304,220 are each continuations-in-part of Ser. No. 254,403 filed May 18, 1972 (U.S. Pat. No. 3,785,854 granted Jan. 15, 1974), Ser. No. 90,682 filed Nov. 18, 1970 (U.S. Pat. No. 3,764,371 granted Oct. 9, 1973) and Ser. No. 219,514 filed Jan. 20, 1972 (U.S. Pat. No. 3,801,357 granted Apr. 2, 1974). Ser. Nos. 466,908 and 446,473 are also continuations-in-part of Ser. Nos. 404,665, 357,616 and 304,220. Ser. No. 404,665 is a continuation-in-part of Ser. Nos. 357,616 and 304,220; Ser. No. 357,616 is a continuation-in-part of Ser. No. 304,220, and Ser. No. 90,682 as well as Ser. No. 219,514 are both continuations-in-part of Ser. Nos. 837,811 filed June 30, 1969 (subsequently abandoned). In addition Ser. No. 254,403 is a continuation-in-part of Ser. Nos. 90,682 and 219,514, while Ser. No. 90,682 is also a continuation-in-part of Ser. No. 219,514.

The present invention relates to the coating of metals to increase their resistance to corrosion and other chemical attacks.

Among the objects of the present invention is the provision of novel coating techniques and compositions for use therewith, as well as novel coated products, all suitable for commercial operations.

Additional objects of the present invention include compositions and techniques for confining protective diffusion coatings to desired locations on workpieces such as jet engine components to be protected by the coatings.

The foregoing as well as further objects of the present invention will be more fully understood from the following description of several of its exemplifications.

According to one aspect of the present invention a ferrous metal such as in the compressor section of a turbine engine is very effectively protected against attack by a coating combination having as a first layer a baked mixture weighing between about 0.1 and 0.5 milligrams per square centimeter of phosphoric and chromic acids and their magnesium salts, which mixture has about 0.2 to about 1 mol of chromate ion and about 0.7 to about 4 mols of phosphate ion for every 0.4 to 1.7 mols of magnesium ion, and the baking of which was to a temperature at least as high as 300° C., and a covering layer on the first layer, which covering layer weighs about 0.5 to about 1.5 or even up to 3 milligrams per square centimeter, is essentially aluminum flake and the baking of which was to a temperature at least as high as 300° C.

The flakes of aluminum very quickly spread over the surface to which they are applied as a dispersion in a liquid, and thus cover the entire surface in a very effective and thorough way. This is an important factor in providing the protection of the present invention.

Mixing with the aluminum flake about 1 to about 10% magnesium powder by weight, provides even better protection. Increasing the baking temperatures, or the final baking temperature, as for example to 450° C., 500° C., or higher, also increases the degree of protection whether or not magnesium is present in the top layer but temperatures above about 650° to 700° C. can adversely affect some ferrous metals.

Best results are obtained with ferrous metals containing at least 1% chromium, and stainless steels such as martensitic or age-hardenable steels generally used for jet engine compressor section parts, are ideally suited for protection by the above-described coating combination. Interchanging the two layers so that the flake aluminum layer is against the surface of the substrate metal and the magnesium-phosphoric-chromic mixture overlies the flake aluminum layers also produces very good results. Such combinations with the layers in either order, or similar combinations in which all the coating ingredients are in one layer, are substantially more effective than the similar multi-layer combinations described in Ser. No. 614,834 and the disclosure of that application is incorporated in the present specification as though fully set out herein. That application points out that the heating of an aluminum flake layer on a ferrous metal in air at about 900° F., causes some of the aluminum to diffuse into the ferrous surface.

As pointed out in the earlier applications, a preliminary diffusion aluminizing of the ferrous metals greatly improves the corrosion resistance provided by the foregoing top coatings, particularly for those ferrous surfaces containing at least 1% chromium. In some cases such diffusion aluminizing is best masked off from undesired portions of the surface of the workpiece being coated. Thus where the dimensional accuracy of a workpiece is of a high order, such as on the root of a rotor blade that is to be securely received in a socket, it is frequently impractical to permit aluminizing of that root because the added aluminum increases the root's dimensions. Such masking problems arise more frequently with the superalloy components in the hot section of a turbine engine, where aluminizing and chromizing is widely practiced. Chromizing also increases dimensions.

Turning now to a more detailed description of the present invention, the following is an example of a very effective flake-aluminum type coating combination typical of the present invention.

EXAMPLE 1

A compressor rotor made of Greek Ascology is cleaned by blasting with 220 grit alumina, and then sprayed with the following aqueous solution:

| | |
|---|---|
| CrO$_3$ | 37.6 g. |
| MgCr$_2$O$_7$ | 19.8 g. |
| Mg(H$_2$PO$_4$)$_2$ | 195 g. |
| Water | to make 1 liter | to form a coating layer weighing about 0.3 milligram per square centimeter, after drying. This layer was baked at 700° F. for 20 minutes, and permitted to cool.

There was then sprayed over the thus-coated rotor, a dispersion of flake aluminum to form a layer about 0.2 mil thick after drying, and the rotor now fired at 900° F. for 10 minutes. The resulting product shows excellent resistance to corrosion when operated in a jet engine in salty marine atmosphere.

The flake aluminum is easier to disperse in the water in a high concentration when the dispersion contains a little polyglycol as well as some dispersing agent, as described in U.S. Pat. No. 3,318,716. These additives are driven off by the firing treatment.

The adhesion of the flake aluminum coating and the corrosion resistance of the workpiece are increased when the dispersion of the flake aluminum contains some hexavalent chromium compound such as magnesium chromate, magnesium dichromate, chromic acid, ammonium chromate or ammonium dichromate. About 5 to about 40% magnesium chromate pentahydrate, or about 3 to about 25% of anhydrous magnesium chromate, based on the weight of the flake aluminum, gives very good results and such mixtures provide desirable protective coatings for the foregoing aluminized or unaluminized metals, even when used without other coatings. The final firing operation converts the magnesium chromate to water-insoluble material in addition to driving off any polyglycol and dispersing agent present in the aluminum dispersion. The magnesium chromate oxidizes some of such polyglycol and/or dispersing agent, and some of the hexavalent chromium is reduced to trivalent conditions in the fired coating, whether or not polyglycol or dispersing agent is used.

Even better corrosion resistance is obtained when the sprayed-on dispersion of flake aluminum also contains powdered magnesium in a quantity about 5% by weight of that aluminum.

Repeating Example 1 but with the aluminum flake layer applied as a first coating and the magnesium-chromic-phosphoric layer as a top coating also gives very good results but care is needed to apply the top coating without disturbing the aluminum flakes in the first coating layer. It is preferred to include the magnesium chromate in the aluminum flake layer to better anchor those flakes when that layer is baked. Alternatively the aluminum flake layer can only be lightly baked so that the glycol dispersing aid is not completely driven off and helps hold the flake in place.

It is also helpful after the aluminum flake layer is baked, to apply over it a very thin stratum of porous filler such as fine alumina or silica particles, before the top layer is applied, as in the following example.

EXAMPLE 2

A batch of martensitic stainless steel jet engine compressor blades was treated by first degreasing and grit blasting, then sprayed with a dispersion of

| | |
|---|---|
| MgCrO$_4$ | 2.5 g. |
| Flake aluminum | 12 g. |

-continued

| | |
|---|---|
| Polyethylene glycol mixture ranging from penta- through hepta-ethylene glycol and having average molecular weight of 300 | 13 g. |
| Para iso-nonyl phenyl ether of dodecaethylene glycol | 1 g. |
| Water to make 100 cc. total | | to deposit a layer weighing 1.5 milligrams per square centimeter after drying and baking at 400° C. for 10 minutes.

Over the resulting coating there was then sprayed an aqueous dispersion of colloidal alumina particles about 5 millimicrons in size to deposit a film weighing about 0.2 milligrams per square centimeter, after air drying.

Finally there was sprayed over the colloidal alumina film a layer of the CrO$_3$—MgCr$_2$O$_7$—Mg(H$_2$PO$_4$)$_2$ composition of Example 1 to add a further weight of 1 milligram per square centimeter, and the blades so coated dried and baked at 1000° F. for 20 minutes. These blades have better corrosion resistance than those coated in Example 1.

Colloidal silica can be substituted for the colloidal alumina without materially affecting the results. The colloidal film should weigh between about 0.1 to about 0.4 milligrams per square centimeter. When the pH of the colloidal layer is above 7 it is helpful to bring it down to below 7. Thus a little CrO$_3$ or H$_3$PO$_4$ can be added to the colloidal dispersion to shift its pH to 4 or even 3.

Similar results are obtained when the proportions of the coating ingredients are varied through the ranges given above, and when other ferrous metals such as 410 stainless, 17-7 PH, 17-4 PH and AISI 4140, containing at least 1% chromium, are substituted for the Greek Ascology or for the martensitic stainless steel. Ferrous metals, such as 1010 steel, containing less than 1% chromium have their corrosion resistance also increased by the coating combinations of the present invention, but the level of corrosion resistance thus attained by these metals is much lower than that attained by corresponding coated ferrous metals containing at least 1% chromium.

The coating recipe of Example 2 also gives excellent results when applied to compressor blades made of titanium or titanium-base alloys. Indeed for coating such alloys the layer of flake aluminum can be omitted, along with the MgCrO$_4$ used to help anchor that aluminum. The resulting combination of colloidal silica or alumina layer, plus the top CrO$_3$—MgCr$_2$O$_7$—Mg(H$_2$PO$_4$)$_2$ layer provides very effective protection and is better than a single layer having the colloid particles included in the coating mixture from which the top layer is applied. It is helpful however to incorporate a little polytetrafluoroethylene in the top coating as described in U.S. Pat. No. 3,948,687.

On the other hand the aluminum flake layer by itself, with or without the MgCrO$_4$, is more adherent to the metal substrate particularly when the substrate is to be flexed. Thus a sheet of 1010 steel when coated with the first coating mixture of Example 2 and baked at 900° to 1050° F. for 90 minutes leaves a water-insoluble layer weighing 1.5 milligrams per square centimeter that provides a high order of rust resistance. This protection includes galvanic action, as shown by the failure of rust to appear in scribed lines cut through the coating of the coated sheet, after the scribed sheet is exposed to salt spray for an extended period.

Two or more layers of the leafing aluminum-hexavalent chromium compound can be applied with or without intervening bakes. In general the total build-up whether a single layer or multiple layers, should be from about 0.1 to about 1 mil in thickness, preferably with the aluminum constituting by weight from about 60% to about 96% of the mixture with the hexavalent chromium compound, measured on an anhydrous basis. These coatings are conveniently applied from aqueous mixtures formed by adding the flake aluminum to an aqueous solution of the hexavalent chromium compound having at least 4% strength, on an anhydrous basis, and such mixtures make suitable articles of commerce. Prepared mixtures of this type are suitable for protecting jet engine compressor parts made of ferrous metal such as martensitic stainless steels, as well as protecting plain carbon and low alloy steels.

Such mixtures can also be used to touch up flake-aluminum-containing coatings on jet engine compressor parts or on other objects, even after those coatings have been cured by baking at temperatures as high as 900° F. Such coatings sometimes become scratched or marred in a localized area, and an aqueous dispersion of flake aluminum such as those described above, whether or not they contain dissolved magnesium chromate, or a mixture of magnesium chromate and phosphoric acid, can be readily brushed over the scratched or marred section, and permitted to dry. The touched-up portion then has the same aluminum flake appearance as the undamaged coating, and if the touch-up is confined to small areas the resulting corrosion resistance is not significantly different from that of an undamaged coating. This touch-up technique can be used on aluminum flake coatings deposited from mixtures with a hexavalent chromium compound like $MgCrO_4$, or from mixtures that contain magnesium chromate and phosphate as in Example 1.

A layer of flake aluminum with $MgCrO_4$ is also very effective for providing a mirror surface on sheets of glass or silica or the like. Such a mirror surface is particularly brilliant when observed through the sheet which carries the layer. The layer is also highly resistant to deterioration even when heated to 1000° F. Mirrors of this type can be for example on Vycor-type glass tubes or the like used as sheaths for electric resistance heaters. The Vycor-type glass, being essentially silica remaining after the leaching of all other ingredients from glass, is itself resistant to high temperatures, and in use bakes the $MgCrO_4$ into water-insoluble condition. The Al—MgCrO$_4$ coating also withstands temperatures as high as 1300° F., but at such high temperatures the aluminum flakes lose much of their brilliance, although the layer remains quite white and highly reflective.

If desired the Al—MgCrO$_4$ layer can be prefired to 1000° F. for about 10 minutes to render it insoluble in water.

An aluminum substrate is also very effectively protected by the magnesium chromate formulations. In addition protective resins can be incorporated in such formulations to further increase the protection, as in U.S. Pat. No. 3,053,693. The following is a good exemplification.

EXAMPLE 3

A hard aluminum compressor impeller for a jet helicopter engine, was cleaned and then sprayed with an emulsion of a hard polymeric methyl methacrylate resin in a dispersion of flake aluminum in aqueous magnesium dichromate.

The recipe for the spray was:

30 cc. of a 1.42 specific gravity solution of $MgCr_2O_7$ in water 58 cc. of a 48 weight % emulsion of an ammonia-stabilized methyl methacrylate polymer in water 50 cc. of an aluminum dispersion formed by dispersing:

42.4 grams leafing aluminum
7 grams octyl phenyl dodecaethoxy ethanol and
50.6 grams hexaethylene glycol in
100 grams of water.

The aqueous film sprayed on was dried and then baked at 350° F. for 30 minutes to leave a 0.1 mil thick coating. The thus coated impeller showed almost no attack after two weeks exposure to a salt spray, so that it was many times more resistant than the untreated impeller. Moreover whatever corrosion products form in use on the coated impeller of the present invention, are only loosely held, and they are easily brushed off, without disassembling the engine. The impeller is generally the sole compressor impeller in such a small engine, whether the engine is used in a helicopter or as a stationary power source, and it can be reached with a cleaning brush inserted through the air intake. It can have the structure shown in U.S. Pat. No. 4,243,359.

The $MgCr_2O_7$-resin coating layer can vary in thickness from about 0.05 mil to about 1 mil, although very thick layers are best applied as a plurality of thin strata that are dried and partly cured before the next stratum is applied. The reults obtained with such a combination are better than provided when $MgCrO_4$ is substituted for the $MgCr_2O_7$. The proportion of resin to $MgCr_2O_7$ by weight, can vary from about 1:4 to 4:1, and other hydrophobic resins such as polypropylene can be used although the hardness of the acrylate resins is preferred.

The following example demonstrates a very effective chromizing combined with a masked aluminizing.

EXAMPLE 4

A batch of first stage PWA 1455 blades for the hot section of a jet engine are cleaned by degreasing in trichloroethylene and then lightly blasting with 220 grit alumina propelled by an air jet at 30 psig. The blades so cleaned are embedded in the following pack, all percentages being by weight

| Powdered chromium | 1.2% |
|---|---|
| Powdered nickel | 2.4% |
| Powdered aluminum | 0.37% |
| Powdered alumina | 96.03% |

All of the powders were minus 325 mesh, their particle sizes ranging from about 20 to about 50 microns, and the mixture well homogenized with repeated siftings, then further mixed with ½% NH$_4$Cl and ½% MgCl$_2$ and placed in a chromized steel retort before the blades are packed. The packed retort was then covered by an outer retort as described and illustrated in U.S. Pat. No. 3,785,854, care being taken that the outer retort has no leaks and is well sealed. The atmosphere in the outer retort is displaced by a stream of argon introduced through an inlet conduit opening near the bottom of the interior of the outer retort and exited through an outlet conduit opening near the top of the interior of the outer retort. Heating of the retort is initiated and the flow of argon maintained through the entire heat at a rate that assure essentially no entrance of air or moisture into the interior of the retorts. Where the outer retort has no leaks, an argon flow of about 5 standard cubic feet per hour is adequate.

The pack is held at 1900° to 1950° F. for 30 hours after which heating was terminated and the retorts permitted to cool, the argon stream being maintained. The retorts can be opened when the pack temperature cools to about 300° F., the blades unpacked, cleaned with a blast of air, and washed with water.

The blades have a very good chromized case 0.6 to 1.2 mils in depth, with no alphachrome and no objectionable oxide increase seen on metallographic examination.

The foregoing chromizing pack is used without a break-in heat, and has so little metal content that it can be discarded after a single use. If desired, its metal content can be salvaged as by pouring a stream of the used pack through a horizontally moving air stream which deflects away the lighter particles permitting the metal particles to be collected.

The pack of Example 4 can be modified by incorporating in it about 0.1% magnesium. Chromized cases produced by a pack so modified have even less undesirable oxide visible on metallographic examination, and are of particularly high quality.

In general the pack of Example 4 can have a chromium content of from about 0.6 to about 2%, a nickel content from about ½ to about 3 times the chromium content, and an aluminum content about 1/10 to about ⅓ the chromium content. The argon atmosphere of that example can be replaced in whole or in part by helium, neon or other inert gas or mixtures thereof. Other inert diluents like kaolin can be substituted for the alumina in its pack.

The used diffusion coating packs of Example 4 contain a small amount of nickel-aluminum-chromium alloy and can be utilized as masking mixtures in low-temperature aluminizing, that is aluminizing conducted at not over about 1400° F. Thus the used pack can be mixed with 1/5 its weight of a 6% solution of poly(ethylacrylate) and the mixture applied by dipping over the roots of chromized blades, to build up a coating weighing 500 milligrams per square centimeter. The masked blades are then embedded in the following powder pack, the percentages being by weight:

| Alumina | 85% |
|---|---|
| Aluminum-silicon alloy (88% Al) | 15% | to which is added ½% NH₄Cl.

A coating heat in hydrogen with a 30 minute hold at 1350° F. deposits a 10 milligram per square centimeter coating over all unmasked surfaces. The blades are then removed from the pack, the masking mixture brushed off, and then heated in hydrogen having a minus 35° F. dew point for 4 hours at 1975° F. to diffuse the aluminum coatings into the surfaces. They are then rapidly air cooled to below 1000° F., aged for 10 hours at 1600° to 1650° F., and again rapidly air cooled to give blades ready for use with roots only chromized and with their airfoil surfaces chromized and then aluminized.

The most elaborate masking arrangement of the present invention uses a three-layer masking combination in which the workpiece-contacting layer is of the essentially inert type, the next layer of the depletion-preventing type, and the outermost layer of the sheath-forming type. Nickel aluminides present in any masking layer other than a sheath-forming layer, should have no more than about 3 atoms of aluminum for every four atoms of nickel.

To make the masking layers easier to apply, it is helpful to add to the resin solution a little long-chain-hydrocarbon acid such as stearic acid that helps keep the particles of the masking composition dispersed in the volatilizable organic solvent in which they are suspended. As little as about 0.1% of such dispersing aid based on the total weight of the suspension, is enough to impart very good flowability so that the painting, or even dipping of the workpieces, is simpler and produces a more uniform masking layer. However dispersing aid concentrations of at least about 0.3% to about 0.5% are preferred, and as much as 1% can be effectively used.

Hydrocarbon chain lengths as short as 12 carbons and as long as 50 carbons or more are suitable for the dispersing aid. Thus lauric acid, myristic acid, oleic acid, and even copolymers of ethylene and acrylic acid, are effective. The dispersing aid should also be soluble in the solvent in which the masking composition is suspended, and hydrocarbon type solvents including halogenated hydrocarbons give best results.

The effectiveness of the dispersing aid is increased by also dissolving in the suspension a small amount of a surface-active agent, preferably a low-forming non-ionic surface-active agent such as polyethoxy ether of a linear primary alcohol like cetyl alcohol, or of an alkyl phenol. Only about 0.1% of surface-active agent is all that is needed. It should be noted in this connection that the surface-active agent when added without the long-chain-hydrocarbon acid, has substantially no effect on the masking suspension.

The masking compositions of the present invention can be used to prevent chromizing or to prevent aluminizing. The nickel and/or nickel aluminide in the masking layers combines with either chromium or aluminum or both and in this way prevents significant penetration of either of these metals to the workpiece surface on which the masking is applied.

The essentially inert layer of the masking combination need only weigh about ⅛ gram per square centimeter to improve the masking action by preventing roughening of the workpiece surface being masked. That layer can also weigh as much as about 2 grams per square centimeter, and can be composed of inert materials such as alumina, kaolin or MgO. The presence of about ½ to about 5% chromium metal in the essentially inert layer or in the layer above it, contributes a strong depletion-reducing effect.

The sheath-forming layer can also be used as a very effective mask without any other helping layers, when aluminizing at temperatures below 1100° F. Sheath formation seems to be caused by the sintering together of the nickel particles in the outer masking layer, under the influence of the diffusion atmosphere which causes diffusing metal to diffuse into the nickel of these particles. These particles thus grow in size. The $Cr_2O_3$ particles appear to form some chromium metal that becomes aluminized and sinters to a sheath.

Sheath formation can also be effected by adding to the sheath-forming layer a metal powder like aluminum the particles of which sinter to the nickel particles. Excessive addition is to be avoided to keep the added metal from contaminating the workpiece. Thus an aluminum addition of this type should contribute no more than about one atom of aluminum for every atom of nickel. As little as one one-hundredth of that proportion of aluminum helps the sheath formation, particularly where only a light diffusion is being performed.

The sheath-forming layer can be used to lock masking mixtures about a workpiece surface by partially or completely enveloping that surface. However, such sheath formation will also securely hold a masking mixture against a portion of a flat or concave workpiece surface, particularly when such a combination is embedded in a powder pack in a diffusion coating retort.

Other inert diluents such as kaolin or MgO can be substituted for some or all the alumina in each of the foregoing formulations.

It is convenient to have a kit of masking materials for selective use as needed. Thus one such general utility kit contains separately packaged the inorganic ingredients or ingredient mixtures of the three masking layers of Example 1 in Ser. No. 782,855, along with a separate quantity of the methyl chloroform solution and a separate quantity of methyl chloroform make-up to replenish slurries that have lost excessive solvent through evaporation. The appropriate inorganic ingredients can then be selected and added to the methyl chloroform solution to make any or all of the foregoing layer-forming slurries.

A very desirably kit of this type has
(a) a quantity of diffusion-masking powder,
(b) a quantity of sheath-forming powder, and
(c) a solution of a binder in a volatile organic solvent,
the quantities being so related that the sheath-forming powder is sufficient to form a layer over a continuous layer of the diffusion-masking powder, and the solution forms a workable slurry with both powders.

Such a combination can have for example:
2000 grams of the diffusion-masking mixture of Ni$_3$Al, chromium and alumina described for the first coating layer of Example 3 in Ser. No. 851,504;
3000 grams of the sheath-forming mixture of Ni, Ni$_3$Al and alumina described for the third layer of Example 5 of Ser. No. 851,504; and
one liter of the resin solution of Example 5 in Ser. No. 851,504.

For special situations, one or more of the foregoing ingredient units can be omitted from a kit.

The fragments of sheath broken away from the workpiece after the diffusion coating is completed, can contain large quantities of nickel, and such nickel can be recovered from the fragments, if desired, as by dissolving it out in acid and separating the dissolved nickel from dissolved aluminum by ammoniacal precipitation of the aluminum. Alternatively, the fragments can be crushed into powder, their inert diluent such as alumina separated from the crushed powder by dropping that powder through a horizontally moving airstream that deflects the less dense diluent more than the more dense metal, melting the resulting metal with sufficeent freshly added aluminum or nickel to convert the melt to Ni$_3$Al for reuse as such.

Omitting the stearic acid from the slurries used to apply the masking layers makes it more difficult to keep the slurries uniformly suspended and calls for the slurries to be shaken frequently to reduce settling.

Using the first and/or second masking layers without the third layer causes the applied masking layer or layers to develop cracks and gaps during the diffusion heating as a result of the thermal driving off of the binder resin. This causes such masking to be unreliable.

Omitting the nickel from the outermost of the three layers keeps it from forming the desired protective shell, unless the omitted nickel is replaced by Cr$_2$O$_3$. The remaining ingredients of the outermost layer make it more generally effective and easier to apply, but are not essential.

Water can be used in place of or in addition to the volatilizable organic solvent in the foregoing slurries but is not preferred, even when used with a water-soluble or water-dispersible binder.

The substitution of other acrylic resins such as poly (ethyl acrylate) or similar binder resins for the poly (ethyl methacrylate) of Example 5 of Ser. No. 851,504 does not materially change the results. Other solvents such as toluene can also be substituted for the methyl chloroform, but the methyl chloroform has a combination of non-flammability, volatility and lack of health hazard, that makes it particularly desirable.

The outermost or sheath-forming layer of the masking combination makes a very effective retaining or securing means that assures the locking of other types of layers beneath it onto the workpiece surface through the coating heat. The same securing action can be used to hold a slurry coating layer instead of a masking layer, on the workpiece. This is illustrated in the following example and makes it unnecessary to have the workpiece embedded in a coating pack.

EXAMPLE 5

A 5-foot length of steam generator high pressure tubing of Croloy alloy (1.9 to 2.6% Cr, 0.97 to 1.13% Mo, 0.15 % C, balance essentially iron) having a ¾ inch bore and a ½ inch wall was thoroughly cleaned inside and out, and had its bore filled with a chromizing pack composed of a previously broken-in mixture of
10% chromium powder the particle sizes of which range from about 10 to about 20 microns, and
90% tabular alumina granules having a particle size ranging from about 100 to about 300 microns
to which mixture was added ½% NH$_4$Cl granules as an activator. The breaking-in was effected by a mixture of the foregoing three ingredients in a retort in the absence of a workpiece, to 1800°–1850° F. for 10 hours under hydrogen. The tube so filled had its ends capped with 1010 steel caps frictionally fitted over the tube ends so as to provide semi-gas-tight covers.

The outside surface of the tube was then painted with the following layers in succession, drying the first layer for a few minutes before applying the second:

first layer—600 grams of a previously broken-in mixture of 45% Cr, 45% alumina and 10% Al, to which ½% NH$_4$Cl is added before as well as after break-in as described in U.S. Pat. No. 3,801,357, suspended in 200 cc of methyl chloroform solution containing 7 weight percent of a copolymer of 70% ethyl and 30% methyl methacrylates, 0.5 weight percent stearic acid and 0.1 weight percent cetyl ether of decaethoxy ethanol. Four applications of this mixture are made with intervening drying to build the non-volatile coating to 1200 milligrams per square centimeter of tube surface.

second layer—600 grams of a mixture of 68.5% Ni powder and 31.5% Al powder, dispersed in 150 cc of above methyl chloroform solution. The metals of this slurry were not pre-fired, and only two applications of this slurry was made to provide a non-volatile coating weight of about half that of the first layer.

The tube so prepared was placed in a tubular retort of a diffusion coating furnace assembly having inlet and outlet connections for a hydrogen-blanketing as in U.S. Pat. No. 3,801,357 and then subjected to a diffusion coating heat of 1800° F. for 10 hours. After cooldown at the end of the heat, the tube end caps were removed, the pack in the tube bore poured out, and the sheath around the exterior of the tube broken off and removed. The interior of the tube was effectively chromized with a case 1.8 to 2.3 mils thick, and the outside of the tube aluminized with a case about 24 mils thick.

The chromized case included an outer portion about 0.3 mil thick rich in chromium carbide, and an inner portion of columnar chromized structure. This case is particularly effective in reducing erosion of the internal tube surface by rapidly moving high pressure steam.

The aluminized outer surface prolongs the life of the tube in a coal- or oil-fired furnace where it is subjected to combustion atmospheres at temperatures as high as about 1000° F.

The internal pack is a highly fluent composition that is easily poured into place before the heat, and is readily removed afterwards, using a minimum of mechanical poking and the like. Such a pack is particularly desirable for packing of cramped recesses in the interior or workpieces, such as in the narrow bores described above, or in hollow jet engine blades, or the like.

The noted fluency is brought about because the alumina granules, which are crushed from alumina which has been melted and solidified, are quite fluent and show a flow angle of about 45 degrees. This is the angle of incline (measured from the horizontal) of a cone made by pouring a stream of the granules onto one spot to build up a cone. The fluency can be increased by selecting aluminas or other than inert particles having an even smaller flow angle. Thus alumina microspheres having particles sized about 100 to about 500 microns are exceptionally fluent. Tabular alumina, which can be made by sintering alumina powder and then crushing, is also fluent, and is preferred because it tamps in place better and then during the diffusion coating does not shrink from the surface against which it is tamped.

The pack need only have about ½ its volume of any of the foregoing fluent materials. Thus the chromium particles by themselves need not be fluent at all, and will provide a suitable fluent pack when ½ of the pack is constituted by the fluent granules or microspheres. Similarly non-fluent alumina or other non-fluent inert material can be present in the pack with or without non-fluent chromium powder, without detracting significantly from the fluency provided by the foregoing volume of fluent material.

Fluent packs are very helpful when the workpiece being coated has a portion of its surface masked to prevent coating there. For such masking the shell-forming masking materials described in application Ser. No. 752,855 (U.S. Pat. No. 4,208,432) are highly desirable, and the fluent coating pack makes it easier to recover the masked workpiece at the completion of the coating operation with their masking intact. Little or no mechanical working of the fluent pack is needed to remove it from the retort and thus expose the masked workpieces. Thus a used fluent pack is readily removed from the interior of a narrow pipe, for instance, by pushing a narrower tube into the pipe bore and blowing air through the tube as it moves into that bore.

Fluent coating packs also do not require much tamping into place and this reduces the chances of disturbing the masking when the masked workpieces are loaded into a retort at the beginning of a coating operation.

The key feature of the improved masking is the application on the surface portion to be masked, of one or more layers of a masking mixture that inhibits depletion of important alloy ingredients from the substrate as a result of outward diffusion during the diffusion coating heat, and also forms a protective shell to secure the masking in place. The layer or layers are conveniently applied from a dispersion in a volatile solvent in which is dissolved in resin such as an acrylate that is driven off during the diffusion coating heat. The dispersion is very simply applied by brushing or dipping and the volatile solvent, such as methyl chloroform, permitted to evaporate off for a few seconds to set the solids.

A very effective depletion-preventing slurry is essentially a mixture in the following proportions, of

| | |
|---|---|
| Ni$_3$Al powder | 40 to 60 grams |
| Cr powder | 4 to 6 grams |
| alumina powder | 40 to 60 grams | in 50 cc of a 5 to 10% by weight solution of poly(ethylmethacrylate) in methyl chloroform. The powders preferably have particle sizes no greater than about 50 microns, and any other inert powder, such as kaolin, can be used in place of the alumina. About 200 milligrams of non-volatiles per square centimeter are applied from a single dip or a single brushing in such a dispersion, and the dips or brushings repeated to build up the non-volatile weight to about 400 milligrams per square centimeter. For low temperature diffusion coating as with aluminum, the chromium content of the solids in the above slurry can be reduced and can be as low as 1% of all the solids.

The grey appearance of the foregoing mixtures as applied to the substrates, are sometimes difficult to visually distinguish on the substrate. Should it be desirable to make them stand out with more contrast, the mixture can be given some different color, as by substituting dark green $Cr_2O_3$ powder for some or all of the alumina. Substituting $Cr_2O_3$ for as little as one-twelfth of the alumina makes a distinct improvement in the distinguishability of the applied powder-resin layer.

Some aluminas are colored reddish and they can also be used for increasing the contrast in the appearance of the powder resin layer. If desired a little dye can be added to the dispersion for the same purpose. Where two or more different types of layers are built up to make a masking combination as described in application Ser. No. 752,855 each different type of layer can be given a different color to make them more readily distinguishable.

BRIEF DESCRIPTION OF THE DRAWING

The drawing in FIGS. 1 and 2 illustrate embodiments of the invention in which tubes are treated.

The fluent diffusion coating packs are also highly beneficial for use in chromizing bent small-bore tubing. Thus for some steam-generating arrangements lengths of steam-generating tubes have one end bent back 180 degrees to form cane-shaped units which can have their ends welded to additional lengths to form a continuous furnace tube assembly. The packing of the bores of such "canes" for diffusion coating, and the subsequent pack removal after coating, is greatly simplified by the use of fluent packs.

As pointed out, the shell-forming layer used to hold a slurry coating in place where there is not much of an aluminizing or chromizing atmosphere, contains non-contaminating materials that sinter together under coating conditions. Thus nickel and aluminum powders smaller than about 500 microns in size and in an atom proportion from about 1:0.9 to about 1:1.1 are very effective. Chromium can be substituted for the nickel in such a mixture. Because of the non-contaminating character, a diffusion coating pack will not be ruined in the event a small amount of the masking materials should inadvertently become mixed into it.

Masking of diffusion coatings can also be accomplished in other ways. Thus on ordinary irons and steels as well as low alloy steels, a localized layer of powdered iron appropriately diluted with inert diluent such as alumina, can be applied to reduce or prevent diffusion coating under the layer. This layer can be covered by a sheath-forming layer, but such covering is not needed where the workpieces are not roughly handled during treatment.

Such simple masking can be effected for example on chain saw cutter blades or other cutting edges that are subjected to substantial wear and it is desired to maintain cutting effectiveness notwithstanding the wear. On this basis the cutting edge can be in the form of a narrow edge face on a steel flange, one surface of the flange being very hard and the opposite surface of the flange being relatively soft. The edge face connects those two surfaces and is preferably tapered so that the edge of the harder surface projects out further than the edge of the softer surface, thus providing good cutting action. During use the edge face wears with the softer portion wearing faster than the harder portion so that the cutting effectiveness of the edge face is maintained quite well.

According to the present invention the cutter blades can be made of carbon steel and can be diffusion chromized on one surface to harden it. The opposite surface is masked as by the iron powder layer referred to above, slurrying it in a solution of a resin binder. Such a slurry can be readily applied, with a medicine dropper for example, to the desired surface of a small blade, and after such a coating layer sets the coated blade can be chromized to harden its uncoated surface.

For chromizing at a low temperatures, such as 1300° to 1400° F., the masking layer need not contain any inert diluent, but at higher temperatures inert diluent such as alumina or kaolin will keep the iron powder from sintering to the cutters. A mixture of iron powder and alumina in which the alumina content is as high as 90% is suitable for masking a modest chromizing. This is illustrated in the following example.

EXAMPLE 6

A quantity of chain saw cutters made of high carbon steel having the formulation
  0.65% carbon
  0.3% manganese
  0.75% nickel
  0.5% chromium
  0.15% molybdenum
  balance essentially iron
are prepared by cleaning and then have their under surfaces individually coated with a slurry of a mixture of 80% alumina and 20% iron powder, suspended in a methyl chloroform solution of 2% poly(ethyl methacrylate) and 0.1% stearic acid. The coating weight of the dried coating is about 100 milligrams per square centimeter.

The resulting cutters are embedded in a chromizing mixture corresponding to that used for the internal chromizing in Example 5 but using non-fluent calcined 360 mesh alumina powder in place of the tabular alumina. The diffusion coating pack so made, held in a retort, is subjected to a diffusion coating heat as in Example 5, the pack being held at 1600° F. for five hours.

After cooldown, the retort is opened and the cutters removed and cleaned. A blast of fine glass particles propelled by a stream of air from a 10 psig source removes the masking layer, and the resulting cutters have a 0.4 mil thick chromized case on the unmasked surfaces. The masked surfaces show much less chromizing as well as a greater degree of wear in use.

A fluent pack is not needed for such chromizing, but can be used if desired. Should portions of the masking layers break off during handling and remain in the coating pack, no significant harm is done inasmuch as such an iron-contaminated pack can still be very effectively reused to chromize ferrous surfaces.

To keep from decarburizing carbon away from the carbon steel being chromized, the chromized temperature can be kept from exceeding about 1850° F., and is preferably not over about 1750° F. Cutter blades made of type 416 stainless steel can also be treated in the foregoing manner with corresponding results.

The diffusion coating of nickel or DS nickel with chromium or aluminum can be correspondingly masked by a masking layer of nickel powder, preferably containing about 20 to about 90% inert diluent to keep it from sintering to the surface being masked. Other substrates can likewise be masked by a powdered masking layer having the same or essentially the same composition as the substrate. Some substrate ingredients such as carbon, silicon, manganese and aluminum generally do not have to be present in such masking layer to minimize loss of those ingredients from the substrate during a diffusion heat.

Instead of completely masking off a diffusion coating in selected locations, the diffusion can be arranged to form a thinner case in selected locations, as for example where dimensional tolerance is very tight. This is demonstrated in the following example.

EXAMPLE 7

Hollow first stage PWA 1422 blades for the hot section of a jet engine had their interiors and exteriors cleaned by the degreasing and blasting described in Example 4, and their interiors were then filled with the following powder pack mixture, all percentages being by weight:

| | |
|---|---|
| $Al_2O_3$ | 40% |
| Chromium | 45% |
| Aluminum | 15% | to which ½% $NH_4Cl$ was added. All of the powders had particle sizes between about 20 and about 50 microns, and the mixture had been pre-fired with a previous addition of ½% $NH_4Cl$. The filling of the interiors was assisted by vibration of the blades.

Each blade then had its airfoil end embedded in a batch of the following powder pack mixture held in a short aluminized steel tube closely fitting the airfoil, as described in U.S. Pat. No. 3,842,122:

| | |
|---|---|
| Al$_2$O$_3$ | 75% |
| Chromium | 15% |
| Aluminum | 8.8% |
| Silicon | 1.2% | to which ½% NH$_4$Cl is added. This mixture had also been pre-fired to break it in with a previous addition of ½% NH$_4$Cl.

The collection of blade-holding tubes was then placed in a shallow aluminized retort, with the root of each blade pointing up, and that retort was then filled with the same powder pack used to fill the blade interiors, until all roots were covered by that pack. The retort so packed was then covered with an outer retort and subjected to a coating heat treatment in a hydrogen atmosphere, with the temperature held at 1620° to 1700° F. for 6 to 7 hours. After cooldown the retort is unpacked, the blades removed and cleaned both internally and externally, given the post heat treatment described in Example 4 except that the diffusion temperature is held at 1980°–1990° F. The final products showed 1 to 2.5 mil thick aluminized cases in their interiors and on their roots, with a 3 to 4.5 mil aluminized case on their airfoil surfaces. All coatings were of high quality.

The formulation for the two packs of this example can be varied as by a plus or minus departure from the above metal (including silicon) content figures, by an amount about ⅛ each figure. It is preferred however that the chromium-to-aluminum weight in the first pack be between 2.9 and 3.1.

The cold or compressor section of jet engines have their components made of less expensive substrate materials such as stainless steels. These also require coating protection, particularly for use in marine atmospheres. An aluminized case covered by top coatings deposited from aqueous solution or dispersion has been used for this purpose, as described in U.S. Pat. No. 3,948,687.

One very effective top coating is deposited from an aqueous dispersion made by dissolving magnesium oxide or carbonate in phosphoric acid and adding chromic acid, along with fine aluminum flakes, so that the final coating mixture contains about 0.2 to about 0.28 mols/liter CrO$_4$=,
about 0.6 to about 0.9 mols/liter PO$_4$≡,
about 0.3 to about 0.45 mols/liter Mg++, and
about 20 to about 40 gram/liter aluminum.

The flakes are preferably no greater than about 20 microns in maximum dimension and are dispersed in the mixture with the help of a wetting agent and a polyethylene glycol as described in U.S. Pat. No. 3,318,716 granted May 9, 1967 as well as in application Ser. No. 614,834.

Such coating mixtures do a very good job of improving the corrosion resistance of the substrate when applied, as by spraying, so as to deposit a coating that after drying weighs about 0.3 to about 2 milligrams per square centimeter, and is baked at 600° to 900° F. for at least 15 minutes, preferably 30 minutes, to render it essentially insoluble in water. The protection is indeed so effective that it does not need the preliminary porous base coating of colloidal alumina or the like as described in U.S. Pat. No. 3,948,689. The following is a typical example.

EXAMPLE 8

A solution is prepared by dissolving in 1280 grams of water:

| | |
|---|---|
| 30 grams | CrO$_3$ |
| 21.5 grams | MgO |
| 97.5 grams | H$_3$PO$_4$ (100%) | after which there is added to the resulting solution 48 grams polyethylene glycol having a molecular weight of about 300

6.7 grams p-octyl-phenoxy-tetradecaethoxyethanol (non-ionic wetting agent)

40.3 grams flake aluminum.

A light spray of the resulting slurry over the entire surface of a jet engine compressor section generator can, deposits a uniform layer weighing about 0.5 milligram per square centimeter after drying, and having an aluminum appearance. The coating is dried and then baked for 30 minutes at 850° F. to provide excellent protection.

The baking does not cause any significant reduction of the hexavalent chromium in the coating by the organic ingredients, nor does it cause the aluminum flakes to show signs of attack by the other ingredients. Instead there is an evolution of fumes from the coating as it heats up, indicating that organic ingredients are being driven off.

Any steel having at least about 1% chromium is very well protected by the combination of an aluminized case at least about 0.2 mil thick and the foregoing top coating. Type 3 and type 4 stainless steels including greek ascoloy and age-hardenable martensitic steels as described in U.S. Pat. No. 3,948,689 are particularly suited for such protection.

According to the present invention chromizing can also be effected to provide smooth hard low-friction surfaces on hardened steel. Thus gun barrels of high-carbon steel can have their internal bores chromized to form a hard case not over 1 mil thick that improves the operation of the barrel. Barrels having a caliber of 30 hundredths of an inch, or even less, can be improved in this way.

The pack diffusion chromizing of gun barrels is very readily accomplished with fluent packs as described in application Ser. No. 752,855. The following is an exemplification.

EXAMPLE 9

A group of 30-caliber rifle barrels made of high-carbon steel having the following formulation

| | |
|---|---|
| carbon | 0.7% |
| silicon | 0.4% |
| chromium | 0.85% |
| molybdenum | 0.02% |
| nickel | 0.12% |
| tungsten | 0.005% |
| vanadium | 0.15% |
| balance essentially iron | | have their bores tamped full of the following chromizing pack mixture:

| | |
|---|---|
| fine chromium powder (particle size 10 to 20 microns) | 20% |
| fluent tabular alumina granules | 80% | to which 0.5% ammonium chloride is added. Both ends of each barrel are covered with steel tabs held in place by loops of wire that encircles the barrel ends, and the barrels so filled and covered are laid in one end of a tubular diffusion coating retort such as described in U.S. Pat. No. 3,059,911 granted Oct. 23, 1962. The tubular retort has one of its ends fitted with a gas-tight wall that can be welded in place, and has its other end fitted with a readily removable plug that carries inlet and outlet lines for introducing and removing a bathing gas, and connector cable for thermocouples. The seal between the plug and the retort mouth can be fitted with an asbestos sealing gasket.

The barrels are received in the walled end of the retort, and that end is also encircled by a furnace. The plugged mouth of the retort projects from the furnace so as to make it easier to remove the plug when desired. There is no need to revolve the retort around its longitudinal axis as illustrated in U.S. Pat. No. 3,059,911, nor of embedding the barrels in a powder pack.

The furnace is started and the retort heated to bring its barrel-containing section to 1850° F. where it is held for eight hours. During the heating a slow stream of hydrogen is passed through the retort after the retort has been purged with a stream of argon.

Upon completion of the eight-hour heat the furnace is shut down, the bathing gas switched to argon, and the assembly permitted to cool. When the retort temperature reaches about 1500° F., the plug is removed and the retort tilted to slide the treated barrels into an oil quenching bath. The quenched barrels are then removed from the quenching oil, their interiors are cleaned by poking out the powder pack, rinsing and drying, and the barrels then subjected to tempering at 1250° for 3 hours. The resulting barrels are very hard with bright smooth hard chromium cases about 0.4 to 0.5 mil thick.

Similar results are obtained if the oil quenching is replaced by a quenching with the bathing gas, although the barrel hardness is then apt to be a little lower. Such gas quenching is made more effective by increasing the rate of flow of the quenching gas and removing the hot (1500°–1600° F.) barrel-carrying retort from the furnace, as well as by spraying the removed retort with water or immersing it in water. Inasmuch as there is no packing between the barrels and the retort when using this technique, the hot barrels are very rapidly cooled through the quenching range by any of these cooling aids, and particularly if two or three of them are combined.

In this modification the barrels can be suspended in an outer retort, as by fitting them through the openings of a perforated plate supported near the top of the retort. Projections near one end of the barrels keep the barrels from falling through the openings.

Where the quenching is completed without removing the barrels from the retort, the tempering can conveniently also be effected before removing the barrels. The bathing gas flow through the retort then continues to keep a protective atmosphere around the barrels. Alternatively a conventional tempering furnace can be used, or the retort can be reloaded with barrels that have been removed and quenched, and the reloaded retort subjected to a tempering heat cycle.

The chromized barrel case improves the life of the barrel and its smoothness reduces heating by the friction of a fired projectile moving through it. The presence of substantial amounts of carbon in the steel from which the barrels are made, generally prevents alphachrome from forming, but it is not detrimental to the barrels even if it does form. A portion of the case thickness is added barrel wall thickness, and this increase can be compensated for by initially machining the barrel bore slightly oversize.

The foregoing chromizing can be arranged to provide desirable cases about 0.2 to about 1 mil thick on any high carbon (about 0.5% carbon) low alloy steel used in gun barrels having bores of up to about four inches. The chromium content of the diffusion coating pack can be as little as about 5% and as much as about 50% by weight and need not be absolutely pure but can be contaminated with any of the ingredients of the steel.

The diffusion coating temperature can be as high as about 1900° to 1950° F. or as low as about 1500° F., the coating proceeding at a more rapid rate at higher temperatures. The packs need no break-in heating, and can be reused after replenishing their consumed constituents, although it is no great loss to discard the once-used packs particularly if they otherwise have to be cleaned from adhering quenching oil.

For increasing the resistance of steels, even low alloy steels, to attack by hot sulfur-containing materials, chromizing is very effective when it penetrates more than about 3 mils and is followed by an even heavier aluminizing. Less penetrating treatment of superalloys is disclosed in U.S. Pat. Nos. 3,764,371, 3,694,255 and 4,041,196, and a similar treatment is disclosed in U.S. Pat. No. 3,656,919, but the present invention applies such a sequence to low alloy steels such as those called chromium steels. These chromium steels of the present invention contain from about 0.6 to about 1.5% chromium, and their carbon contents can range from about 0.15% to about 1.10%. This carbon content is not in stabilized form and is accordingly sufficient to seriously limit the case depth obtained by chromizing, as well as correspondingly limit the maximum resistance obtainable against hot sulfidation. Unprotected low alloy steels used in petroleum refinery operations for example, are generally very susceptible to hot sulfidation, so that a high degree of protection is called for.

According to the present invention low alloy steels such as the above-noted chromium steels have their surfaces first decarburized to a depth of at least about 3 mils, then chromized to provide a case at least about 2 mils thick, and then aluminized to a depth of at least about 6 mils. Preferred decarburizing is to a depth of 4 to 6 mils, along with chromizing to provide a case thickness of about 3 to 4 mils, and aluminizing to a final diffusion case of about 10 to about 14 mils.

The respective treatments can be applied individually in spaced operations, or they can be combined as successive stages of a single heat sequence. Each stage can be a conventional one such as:

EXAMPLE 10

I. A number of chromium steel tubes used for a heat exchanger in the oxidative cracking of sulfur-containing petroleum residues were cleaned, and then placed in a retort through which hydrogen having a dew point of 40° to 60° F. is passed, while the retort is heated to 1800°–1850° F. for three hours. Before the treatment, the tubes had 0.7 to 0.8% chromium and 0.18% carbon, their side walls were about ¼ inch thick, their internal diameter about 2 inches, and one end of each tube was flared out and mushroomed back. After the three hour treatment, heating was discontinued and the tubes permitted to cool to room temperature. They showed a surface decarburization about 6 mils deep.

II. The decarburized tubes were then loaded in a vertical retort, the floor of which had a four-inch thick layer of powdered chromizing pack into which the flared ends were embedded. The interior of the tubes were filled with the same chromizing pack, which was a pre-fired 1:4 by weight mixture of chromium powder and the fluent tabular $Al_2O_3$ described in U.S. Pat. No. 4,208,453, with $\frac{1}{2}\%$ $NH_4Cl$ based on the weight of the 1:4 mixture. The retort was then covered and fired as in U.S. Pat. No. 3,801,357 to bring its contents to 1950°–1975° F. for ten hours. Upon subsequent cool-down the tubes showed a chromized case 3 to 4 mils thick, the outer quarter having a chromium-carbide-rich phase with the remainder having a columnar ferrite structure.

III. The chromized tubes were returned to the vertical retort, which this time contained a layer of aluminizing powder pack, and the tube interiors were filled with the same aluminizing pack—a pre-fired mixture of 45 weight % chromium powder, 10 weight % aluminum powder and 45 weight % powdered alumina, activated with $\frac{1}{2}\%$ $NH_4Cl$. The aluminizing heat was at 1950°–1975° F. for ten hours and left a consolidated diffusion case 12 to 14 mils thick. The outer surface of this case contained about 21% aluminum and about 21% chromium, whereas the middle of the case contained about 12.5% aluminum and about 13.7% chromium. These tubes showed a very high resistance against hot sulfidation, and in one instance a tube was attacked so severely that the steel base was completely eaten through leaving an almost unscathed diffusion case as a shell.

Figure 1:
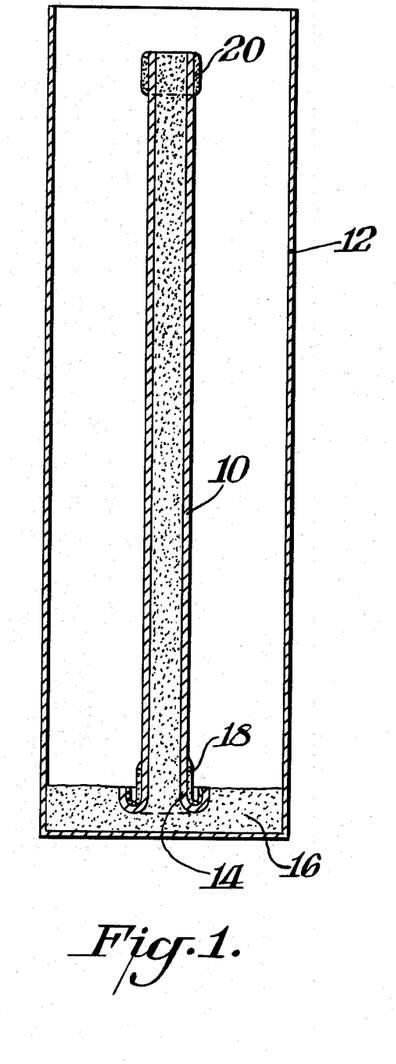

A typical tube of the foregoing type is illustrated at 10 in FIG. 1, where it is shown held in a retort 12 with its reversely flared end 14 embedded in one of the diffusion coating packs. Where the tube has an external surface portion that is not to receive a diffusion coating, as for instance because that portion is closely fitted into a mounting sheet or the like, that surface portion can be masked. Thus slurry type masking coatings can be applied as illustrated at 18 and 20. Alternatively a powder type masking mixture can be poured into the cup-shaped portion of flare 14, and if desired such powder can be held in place with the help of a steel ring fitted around the powder and resting on the upturned lip of the flare.

The decarburizing can be conducted in any convenient way, although it is preferred to use hydrogen having a dew point at least as high as 0° F. The decarburizing temperature can vary in the manner shown in the prior art, and effective decarburizing produces a weight loss of from about 0.3 to about 0.6 milligrams per square centimeter of treated surface. This can be checked by including in the retort a spare coupon of the metal being treated and withdrawing the coupon to check its weight.

The diffusion chromizing and aluminizing can also be varied as disclosed in the prior art. A good chromium pick-up is at least 15 and better still over 25 milligrams per square centimeter of surface, and a good aluminum pick-up is at least 25 and preferably over 40 milligrams per square centimeter.

The separate treatments can be partially or completely run together in a single retort without removing the tubes from the retort between treatment steps. Some combinations of decarburizing with chromizing are mentioned in U.S. Pat. No. 3,449,159, but the decarburizing of the present invention is a very substantial one in which the decarburized zone is not only deep but shows a carbon content well below 0.05%.

Gas chromizing as in U.S. Pat. Nos. 3,449,159 and 3,222,122 is particularly desirable when consolidating the chromizing with both the decarburizing and the aluminizing. The only pack in contact with the tubes in such a consolidation is the aluminizing pack, inasmuch as gas aluminizing is not sufficiently effective.

Figure 2:
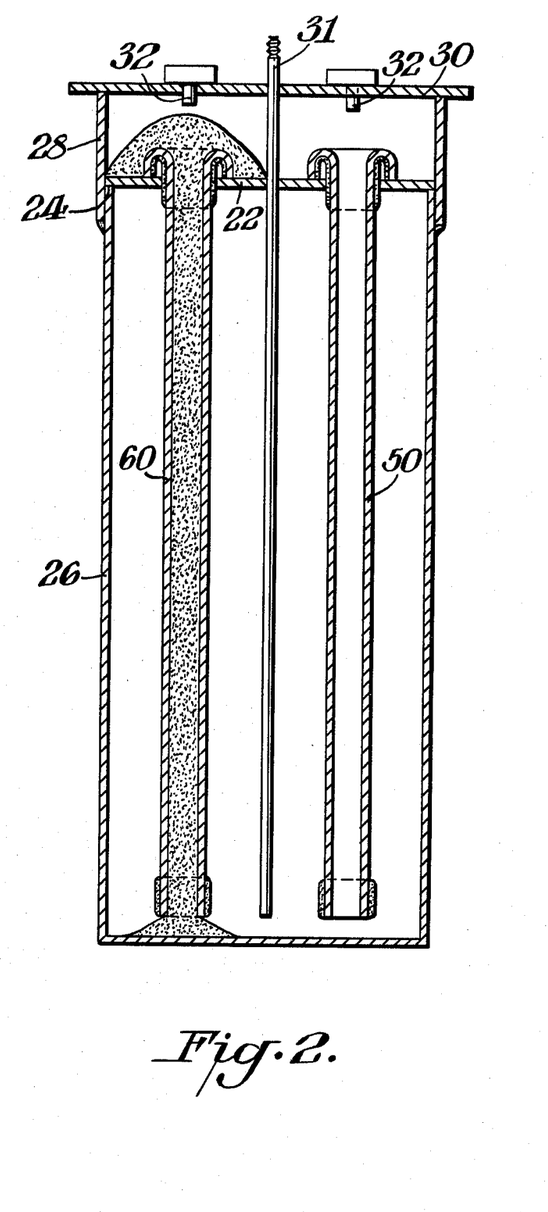

FIG. 2 illustrates a retorting arrangement for consolidated treatments. Two tubes 50 and 60 are here shown lowered through a perforated removable shelf 22 resting on the upper edge 24 of a cylindrical retort shell 26 which has welded around its upper margin a relatively short retort extension 28. The top of the retort is loosely covered with a plate 30 fitted with a vent pipe 31 and a set of nozzles 32 downwardly directed over each tube-receiving perforation in shelf 22. For decarburizing, the tubes are mounted as at 50 and wet hydrogen introduced through nozzles 32 so as to pass downwardly through and decarburize the interiors of the tubes. Some of the introduced hydrogen also spills over the flared tube ends and decarburizes them as well.

When the decarburizing is completed the flow of wet hydrogen is stopped, and gas chromizing streams are introduced through nozzles 32. No other change except for a shift to the chromizing temperature is needed, so that the retort can be kept at operating temperatures throughout.

The next shift is to aluminizing and for this the cover 30 or the nozzles 32 are removed so that a powder aluminizing pack can be poured into the tubes. By keeping the lower ends of the tubes within an inch or so of the retort floor a low fluency pack can be poured in place without building up very much on that floor. On the other hand a more fluent pack can be used with more of the pack spreading out on the floor as well as over the flared tube ends.

It will generally be desirable to cool the retort and its contents somewhat before introducing the aluminizing pack. To this end the burners around the retort can be shut down and a rapid flow of argon introduced through vent 31. Because no thermal insulation is present in the retort, aside from the masking layers, the tubes are fairly rapidly cooled in this way. After sufficient argon flow to flush and fill the retort with that gas, the retort cover or nozzles 32 can generally be removed even though the tubes are still at about 900° F., especially if the rapid argon flow is maintained as a protective shield around the tubes and the openings at the retort top kept very small. The aluminizing pack can then be promptly poured through such openings into the tubes to further cool them both by contact as well as volatilization of the activator contained in the pack. To avoid premature depletion of the activator when so added, the activator content of the pack can be somewhat elevated, such as $1\frac{1}{2}\%$ by weight, instead of the usual $\frac{1}{4}$ to $\frac{1}{2}$ % by weight.

As soon as the pack addition is completed the retort-heating burners can be re-started to carry the retort contents to the desired aluminizing temperature. Where the aluminizing pack is a chromium-free pack, the aluminizing can be very effectively conducted at temperatures as low as 1400° F. or even lower, without much reduction in coating rate. Aluminizing at temperatures below about 1200° F. is best effected with an aluminum halide activator such as $AlCl_3$.

The cooling applied before the aluminizing can be to very low temperatures if desired. Thus cooling to about 630° F. will enable the introduction of an NH4Cl-activated pack without significant loss of NH4Cl by volatilization, and cooling to about 350° F. will similarly minimize loss of AlCl3 from an AlCl3-activated pack. Cooling to 150° F. will enable withdrawal of the chromized tubes from the retort, as for example if they are to be closely inspected to check on the chromized case or to replace the masking. Cut off short pieces of tubing can be placed on shelf 22 to act as test members that can be removed when desired to check on the treatment without removing the tubes themselves.

The consolidating of the aluminizing with the previous treatments requires much more care than the mere consolidation of the decarburizing with the chromizing. This simpler consolidation can also be effected with the use of a chromizing pack rather than a gas phase chromizing, so that such pack is replaced by an aluminizing pack for the aluminizing step.

The exteriors of the tubes subjected to the three-step treatment of decarburizing, chromizing and aluminizing, also show the effects of such treatment steps, although these effects are minimized at the masked areas. The decarburizing of the exteriors reduces the tube strengths, but this effect is insignificant when the tube wall thicknesses are greater than ⅛ inch. Also such decarburized exteriors become chromized to some degree and this strengthens those surfaces.

Other chromium steels and other low alloy steels can be treated in place of the foregoing tubes, to give similarly protected products. Plain steels having about 0.1% or less of carbon are generally not strong enough or sufficiently resistant for use in hot environments, but they too can be similarly chromized and aluminized to yield products showing very little corrosion in hot sulfidation environments, and do not need a preliminary decarburizing. Steels that have their carbon contents stabilized as noted in U.S. Pat. No. 3,449,159, likewise need no decarburizing.

Although full-fledged diffusion coating with chromium and/or aluminum does a very good job of protecting metal substrates, fairly good protection is provided by the simpler chromate-phosphate coatings described above which are merely applied and cured in air. Even the similar phosphate-chromate coatings of U.S. Pat. No. 3,248,251, particularly those that are made with aluminum powder, are quite effective.

However the substitution of aluminum-silicon alloys containing about 10 to about 20% silicon by weight, for the aluminum powder of U.S. Pat. No. 3,248,251 further improves the coatings of that patent. Thus replacing the aluminum powder in the Examle I formulation of that patent, by the same weight of 10 micron powdered alloy of 88% aluminum and 12% silicon, yields a mixture that can be brushed, dipped or sprayed on a 1010 steel or stainless steel workpiece and then baked for 30 minutes at 650° F., to give the product the added resistance that silicon supplies. The cured coating can also be burnished as by vibrating the coated workpiece in a container with standard burnishing media such as hardened steel discs, to further improve the resistance to attack. In general an aqueous coating slurry having at least 0.6 mol per liter of dichromate ion, at least 0.5 mol per liter of dissolved magnesium, at least 0.5 mol per liter of phosphate ion, and at least 10 grams per liter of the aluminum-silicon alloy, are suitable for this improved protection, and can be applied in layers from about 0.5 to about 2 mils thick.

Burnishing also improves the protection provided by the coatings of Examples 1, 2 and 3 in the present specification and of the top coatings described in Ser. No. 73,539 as well as in application Ser. No. 191,780 filed Sept. 29, 1980. It also markedly improves the surface smoothness of the coatings. This is illustrated by:

EXAMPLE 11

A set of AISI 410 stainless steel jet engine compressor blades was prepared for coating by first blasting with fine alumina powder to remove all visible foreign matter. The blades were then tumbled about 30-minutes immersed in a bed of hardened rounded burnishing discs about 5 mm in diameter, in a vibrating burnishing barrel. This visibly improved the surface smoothness. The smoothed blades were then diffusion aluminized in a pack having 20% powdered aluminum, the balance powdered alumina, using ½% aluminum chloride as activator and a diffusion time of 20 hours at 885° F. The resulting diffusion case was about half a mil thick. The aluminized blades were washed, dried, and then sprayed with the aluminum flake slurry of Example 8. Three coats of the spray were applied to bring up the coating weight to about 0.9 mg per cm$^2$. This coating was then baked onto the blades at 700° F. for 20 minutes, after which three more coats of the same aluminum slurry were sprayed over the surface and the baking operation repeated. The thus-coated blades were given a repeat of the burnishing treatment this time for 15 minutes, in the same burnishing media, and this was followed by spraying on another coat of the same aluminum flake slurry. Only about 0.5 mg per cm$^2$ of this spray was applied and the coating baked on at 700° F. for 20 minutes. The baked product was then given another 0.1 to 0.2 mg per cm$^2$ coating sprayed on from the following mixture:

100 cc of a solution of 25 grams MgO and 88 cc 85% H$_3$PO$_4$ diluted to 380 cc with water.

20 cc of the flake aluminum slurry of Example 8.

100 cc of water containing 0.07 grams of octylphenyl-dodecaethoxyethanol wetting agent.

100 cm of a 30% dispersion of colloidal silica in water. Another 700° F.–30-minute bake was then applied followed by a 15-minute burnishing treatment with the above mentioned burnishing media. The product thus obtained presented an excellent appearance and showed a surface roughness of only about 20 microinches.

The top-most coating gave the products a silver-colored appearance. A corresponding gold-colored appearance is obtained by substituting for the top-most coating, a very thin (0.05 mg per square centimeter) spray coat of colloidal alumina, followed by a 0.1 mg per square centimeter coating of the teflon-containing dispersion of U.S. Pat. No. 3,785,854, particularly that of its Example. The final bake and burnishing in the silver-colored coating combination is preferably not omitted when the gold-colored coating is made.

Colloidal alumina can be substituted for some or all of the colloidal silica in the foregoing coatings.

A single vibratory burnishing treatment with polished steel, hardened or unhardened, for at least fifteen minutes does a good job of improving the smoothness of the fully coated products. Also a similar burnishing treatment on a metal workpiece to be coated is helpful where the surface of the workpiece has a roughness greater than about 18 microinches. Where multiple coatings are applied to the workpiece, burnishing provides the best smoothing when applied after each coating.

Obviously many modifications and variations of the present invention are possible in the light of the above teachings. It is therefore to be understood that within the scope of the appended claims the invention may be practiced otherwise than as specifically described.

I claim:

1. The process of diffusion coating a workpiece with chromium and then with aluminum, which process is characterized by loading the workpiece in a diffusion coating retort, then subjecting the retort to a diffusion-coating heat while introducing into it a chromizing vapor to cause the vapor to contact and chromize the workpiece, then without removing the workpiece, introducing into the retort an aluminizing powder pack to cause it to contact the workpiece, and then bringing the retort to diffusion aluminizing temperature to cause the chromized workpiece to be aluminized by said pack before the workpiece is removed from the retort.

2. The combination of claim 1 in which the workpiece is a carbon steel that has its surface decarburized before the chromizing.

3. The combination of claim 2 in which the decarburizing is effected in the retort and the workpiece is not removed from the retort between the decarburizing and the chromizing.

* * * * *

UNITED STATES PATENT AND TRADEMARK OFFICE
CERTIFICATE OF CORRECTION

PATENT NO. : 4,350,719
DATED : SEPTEMBER 21, 1982
INVENTOR(S) : ALFONSO L. BALDI

It is certified that error appears in the above-identified patent and that said Letters Patent are hereby corrected as shown below:

Column 9, line 34, before "layer" insert --continuous--;

Column 11, line 35, after "other" delete --than--;

line 57, change Patent No. to --4,208,453--;

Column 13, line 46, after "at" delete --a--;

Column 14, line 68, change Patent No. to --3,824,122--;

Column 15, line 47, "gram" should be --grams--;

Column 17, line 33, after "1250°" insert --F.--; and

Column 21, line 52, correct spelling of "Example".

Signed and Sealed this

Nineteenth Day of April 1983

[SEAL]

Attest:

GERALD J. MOSSINGHOFF

Attesting Officer

Commissioner of Patents and Trademarks